United States Patent
Redaelli et al.

(10) Patent No.: US 7,259,993 B2
(45) Date of Patent: Aug. 21, 2007

(54) REFERENCE SCHEME FOR A NON-VOLATILE SEMICONDUCTOR MEMORY DEVICE

(75) Inventors: Marco Redaelli, Milan (IT); Luca de Ambroggi, Dresden (DE)

(73) Assignees: Infineon Technologies AG, Munich (DE); Infineon Technologies Flash GmbH & Co., KG, Dresden (DE)

( * ) Notice: Subject to any disclaimer, the term of this patent is extended or adjusted under 35 U.S.C. 154(b) by 14 days.

(21) Appl. No.: 11/145,520

(22) Filed: Jun. 3, 2005

(65) Prior Publication Data

US 2006/0274581 A1 Dec. 7, 2006

(51) Int. Cl.
*G11C 11/34* (2006.01)
(52) U.S. Cl. .............................. 365/185.22; 365/185.24
(58) Field of Classification Search ........... 365/185.22, 365/185.24
See application file for complete search history.

(56) References Cited

U.S. PATENT DOCUMENTS

| | | | |
|---|---|---|---|
| 5,172,338 A | 12/1992 | Mehrotra et al. | |
| 5,508,958 A | 4/1996 | Fazio et al. | |
| 6,011,725 A | 1/2000 | Eitan | |
| 6,055,187 A | 4/2000 | Dallabora et al. | |
| 6,108,259 A * | 8/2000 | Choi et al. ................... | 365/210 |
| 6,151,250 A * | 11/2000 | Choi et al. .............. | 365/185.22 |
| 6,259,627 B1 | 7/2001 | Wong | |
| 6,421,275 B1 | 7/2002 | Chen et al. | |
| 6,449,190 B1 | 9/2002 | Bill | |
| 6,529,405 B2 | 3/2003 | Chang | |
| 6,625,057 B2 | 9/2003 | Iwata | |
| 6,639,849 B2 | 10/2003 | Takahashi et al. | |
| 6,674,668 B2 | 1/2004 | Ikehashi et al. | |
| 6,690,602 B1 | 2/2004 | Le et al. | |
| 6,807,097 B2 * | 10/2004 | Takano et al. ......... | 365/185.03 |
| 6,809,969 B2 | 10/2004 | Ohtani et al. | |
| 6,831,872 B2 * | 12/2004 | Matsuoka ................... | 365/210 |
| 6,912,161 B2 * | 6/2005 | Hirano et al. .......... | 365/185.24 |
| 7,020,037 B2 * | 3/2006 | Anzai et al. ................ | 365/210 |
| 2002/0001226 A1 * | 1/2002 | Banks .................... | 365/185.03 |
| 2002/0118566 A1 | 8/2002 | Jong et al. | |

(Continued)

OTHER PUBLICATIONS

Villa, C., et al., "A 125MHz Burst-Mode Flexible Read-While-Write 256Mbit 2b/c 1.8V NOR Flash Memory," 2005 IEEE International Solid-State Circuits Conference, 0-7803-8904-2/05, pp. 52-53 & 584.

(Continued)

*Primary Examiner*—Michael Tran
(74) *Attorney, Agent, or Firm*—Slater & Matsil, L.L.P.

(57) ABSTRACT

A non-volatile semiconductor memory device is provided comprising a memory area and a circuitry area. The memory area includes a plurality of memory cells and a set of array reference cells that are programmable to have a threshold voltage corresponding to an erased or a programmed state of a memory cell. In the circuitry area, additional main reference cells are provided, which are configured to also have a threshold voltage corresponding to an erased or programmed state of a memory cell. The main reference cells are used for setting of said array reference cells and said array reference cells are provided as a reference for reading or writing a state of said memory cells. A method is also provided for setting array reference cells in a non-volatile semiconductor memory device to a predefined threshold voltage.

27 Claims, 13 Drawing Sheets

U.S. PATENT DOCUMENTS

| | | |
|---|---|---|
| 2003/0208663 A1 | 11/2003 | Van Buskirk et al. |
| 2004/0012993 A1 | 1/2004 | Kurihara |
| 2004/0060031 A1 | 3/2004 | Cernea |
| 2004/0076038 A1 | 4/2004 | Ohtani et al. |
| 2004/0090824 A1* | 5/2004 | Takano et al. ........... 365/185.2 |
| 2004/0109353 A1* | 6/2004 | Matsuoka ................ 365/185.2 |
| 2004/0240269 A1 | 12/2004 | Cernea |
| 2005/0041469 A1 | 2/2005 | Marotta et al. |

OTHER PUBLICATIONS

Taub, M., et al., "A 90nm 512Mb 166MHz Multilevel Cell Flash Memory with 1.5Mbyte/s Programming," 2005 IEEE International Solid-State Circuits Conference, 0-7803-8904-2/05, pp. 54-55 & 584.

* cited by examiner

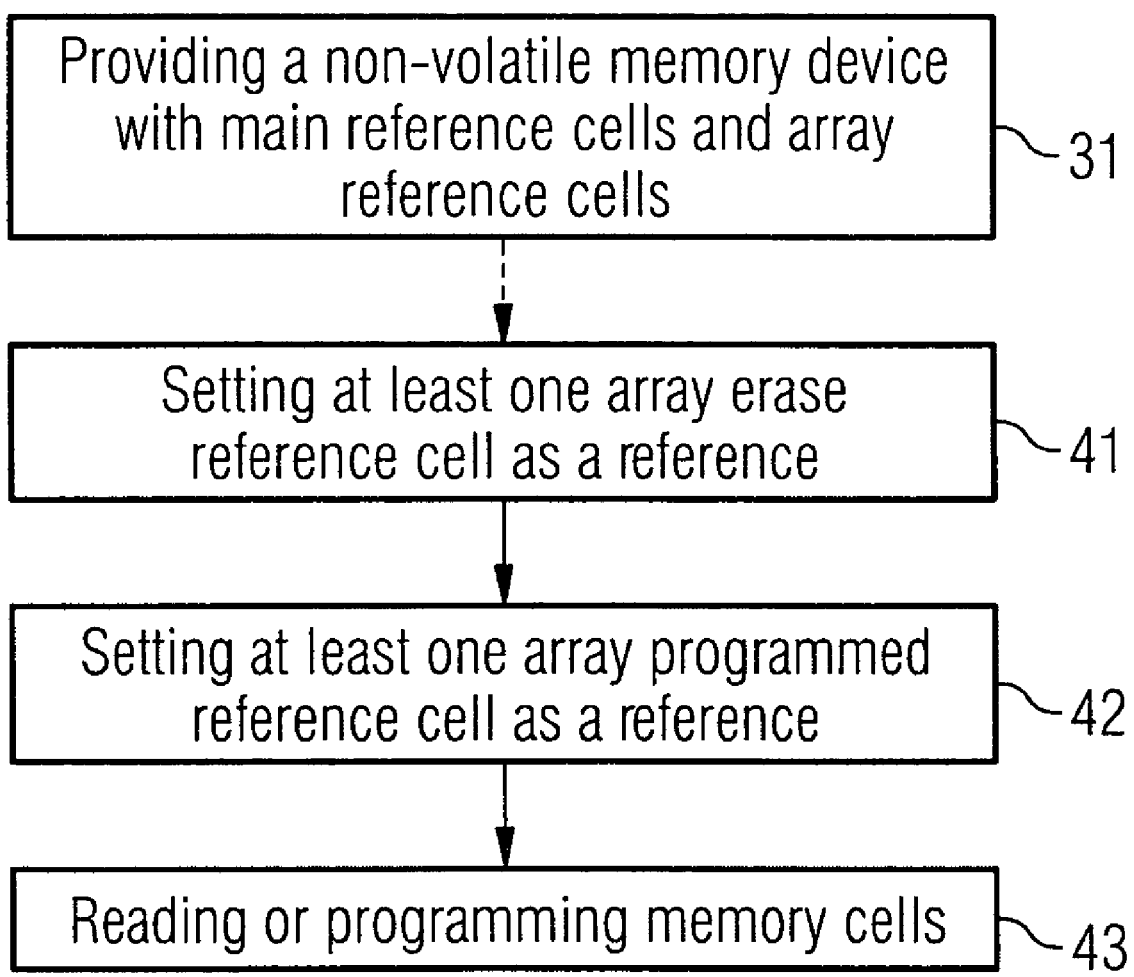

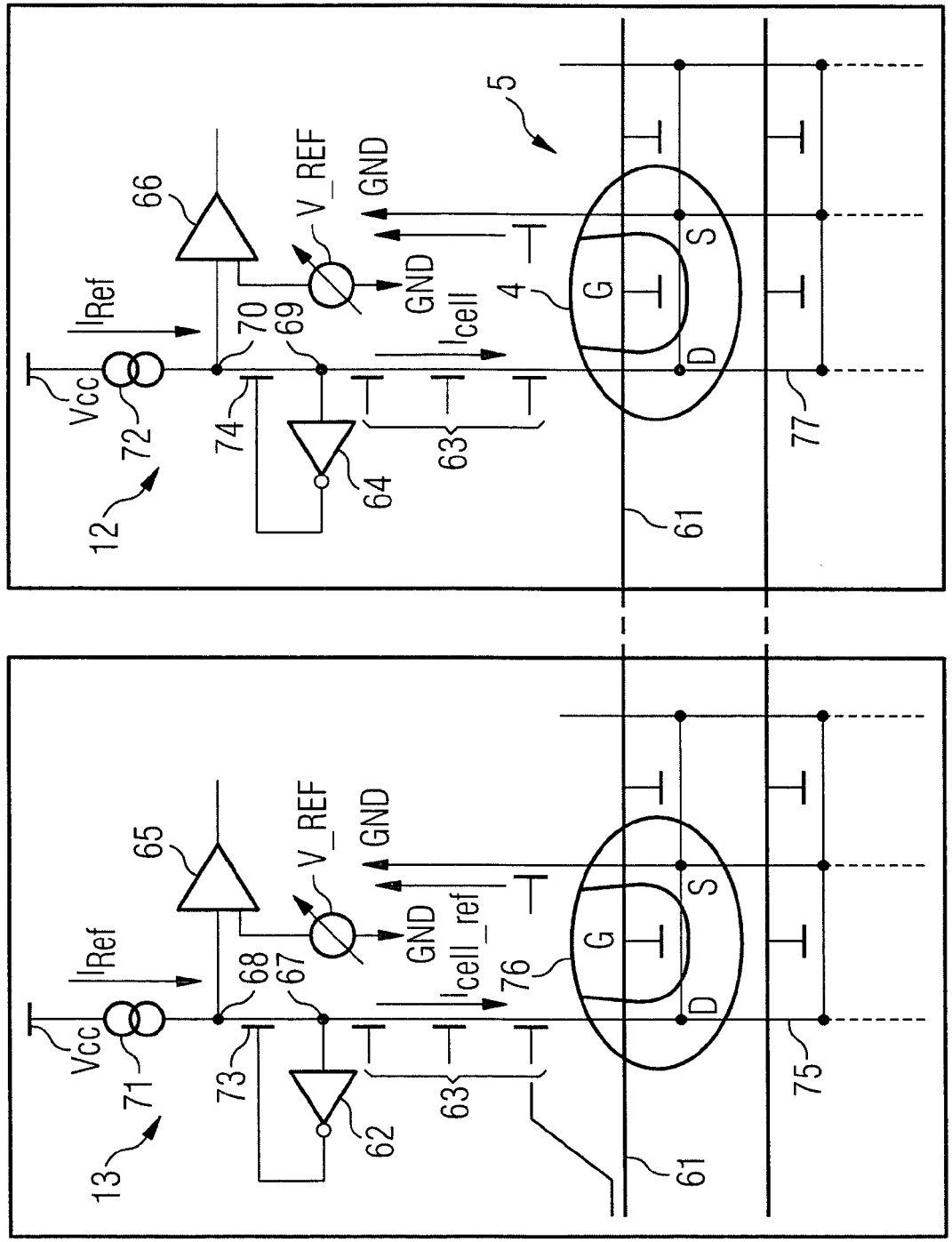

State 1

State 2

State 3

State 4

State 1

State 3

State 2

State 4

REFERENCE SCHEME FOR A NON-VOLATILE SEMICONDUCTOR MEMORY DEVICE

TECHNICAL FIELD

The present invention relates to non-volatile semiconductor memory devices. More particularly it relates to a memory device with reference cells that are set up to provide a reference that is adapted to always fit with properties of memory cells, even after a degrade caused by a long operating time or many read or write cycles. The invention also relates to a method for programming reference cells.

BACKGROUND

Flash memories have become more and more popular recently, especially in the area of portable communication devices. The basic structure of a flash memory is similar to that of a MOSFET, including a gate, a drain and a source. Usually a flash memory includes a floating gate and a control gate, as the gate of the MOSFET. In addition, there are some kinds of flash memories with no floating gate, such as a nitride read-only memory (NROM). Differing from other types of flash memory that use a conducting polysilicon or metal floating gate, a nitride read-only memory uses an oxide-nitride-oxide (ONO) layer as a charge-trapping medium. Due to a highly compacted nature of the silicon nitride layer, hot electrons tunneling from the MOS-transistor into the silicon nitride are trapped to form an unequal concentration distribution.

In general, the flash memory has the functions of reading, programming and erasing. When injecting electrons to the floating gate of the memory cell or injecting electrons to the ONO layer of the memory cell, a threshold voltage, at a low voltage initially, of the memory cell increases relatively and results in a current from the drain to the source decreasing. This is the writing or programmed state of the memory cell. While connecting a negative voltage to the control gate, electrons trapped in the floating gate (or trapped in the ONO layer) are removed from the floating gate or the nitride layer to lower the threshold voltage of the memory cell. This is the erased state. Regardless of the state the memory cell is in, it is necessary to operate a reading procedure during which the bit information stored in the memory cell is read.

For reading information stored in a memory cell, the voltage at the gate input is increased until a predefined current flows from the drain to the source of the memory cell. The actual gate voltage is then evaluated. Alternatively, the current is evaluated while a predefined voltage is applied to the gate. In both cases the conduction window of the memory cell is partitioned into two regions by a breakpoint for defining the state of the memory cell.

More detailed for reading a state of a memory cell using a reference current two mechanisms are common. In a first mechanism a cell is read by applying predetermined, fixed voltages to the gate and drain input. Its drain/source current is mapped to a memory state by comparing it with a reference current. If the current read is higher than the reference, the cell is determined to be in one logical state (for example a LOW-state). On the other hand, if the current is less than the reference current, the cell is determined to be in the other logical state (for example a HIGH-state). Thus, such a two-state cell stores one bit of digital information.

A second mechanism for sensing the state of a memory cell is to bias the gate of the memory cell with a variable voltage instead of a constant voltage. Here the drain/source current is sensed and compared with a constant current. The gate voltage at which the constant reference current is reached by the measured current indicates the state of the memory cell. For programming and erasing memory cells similar operations are necessary, so called verify operations. Verify operations occur during programming or erasing memory cells, they are read operations during write operations that assess a need of a program or erase pulse in order to properly write the data that is to be written into the cell.

In order to increase memory capacity, flash EEPROM (electrically erasable programmable read only memory) devices are being fabricated with higher and higher density as the state of semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. Thus, the information that a given EEPROM array can store increases with the number of states that each cell can store. EEPROM or flash EEPROM with multi-state or multi-level memory cells have been described in U.S. Pat. No. 5,172,338, which is incorporated herein by reference.

Another known possibility for increasing the storage density is to store more than one bit not distinguishing different amounts of electric charge on a conducting layer but to store electric charges in different areas of a gate layer. Such a memory cell is known from the above-mentioned nitride read-only memory devices (NROM). From U.S. Patent Publication No. 2002/0118566, which is incorporated herein by reference, it is known how to read two-bit information in nitride read-only memory cells simultaneously. According to the drain-source current of NROM, a logical two-bit combination message can be identified. The observed current is divided into four different zones and each zone represents a specific logical two-bit information, which is LOW and LOW, LOW and HIGH, HIGH and LOW or HIGH and HIGH.

Storing two bits of information in different regions of the nitride layer has the advantage that the difference between the individual states can be detected easier than in a multi-level memory cell. However, the state of the second bit influences the current flowing through the cell when detecting the state of the first bit and vice-versa. This is also referred to as the second bit effect. The described effect is relevant when reading data but also when verifying data during erase or program operations and therefore must be considered when evaluating a detected cell current. Though the second bit effect is small in comparison with the effect caused by the state of the bit to be read, it can become more important as the operational voltage of the memory cell becomes lower. In order to save power and to allow smaller die structures to be used for a semiconductor circuit, the operational voltages of memory modules are getting lower and lower. Whereas 5V and 3.3V were previously used as supply voltages, new devices use voltages of 1.6V for example.

For reading these flash memory cells it is essential to sense the conduction current across the source and drain electrodes of the cell. Especially for reading of more than two states of a memory cell it is important to have a reference current that exactly reflects the condition of the memory cell. The more states a memory cell is made to store, the more finely divided its threshold window must be.

This will require higher precision in programming and reading operations in order to be able to achieve the required resolution.

The used reference currents are often generated by reference cells that are in a particular state. In most former single-bit or single-level memory architectures, the reference structure for providing appropriate reference currents has been constituted by an array of four or five flash cells corresponding to a programmed state, an erased state, an over-erased or depletion state and a reading state. These reference cells, once programmed to a predefined level, for example at wafer sort, could not be touched anymore.

For several applications, for example for archiving data, it is important that data can still be correctly read after a long time or large number of write cycles. In addition, temperature variations are to be considered. These influences affect the currents read from a memory cell. Temperature variations also influence the reference currents. In typical single-level and single-bit devices the margins set to separate the states of a memory cell define big windows for the different states. The windows are big enough to secure that data is correctly read or written under all conditions. In multi-level and multi-bit memories, the windows have been significantly reduced and it has become a problem to ensure a correct functionality under all environmental conditions and over the whole life period.

The respective need of more accurate references is illustrated in FIGS. 17, 18 and 19. The diagram of FIG. 17 relates to a two-state memory cell for storing one bit of data. It shows the voltages and currents in a memory cell according to FIG. 7. The current $I_{CELL}$ through the memory cell depends on the gate-source-voltage. A lower threshold 121 defines the beginning of an erased state. Below the erased state there is an over-erased state, also called a depletion state. In this state, which is not allowed in normal operation of the memory cell, a current flows from the drain to the source even if no voltage is applied to the gate. The erased and the programmed states are separated by a reference voltage 122. The margin window for the erased and the programmed state are big enough to fit for all conditions.

FIG. 18 shows that in a multi-level cell the margin windows for all states are reduced. For each of the different states a threshold voltage 121, 123, 124 and 125 are defined. FIG. 18, which shows the possible states of an NROM cell, makes clear that the references 121, 123, 124 and 125 must be more accurate than the references 121 and 122 in the diagram of FIG. 17.

From FIG. 19 it can be seen that in multi-bit memory cells an additional problem arises. When reading the first bit of the memory cell it must be considered that the characteristic depends on the second bit. Without consideration of the second bit effect a logical "1" is detected, when the gate-source voltage is in the range referred to as 126. The range of a logical "0" is referred to as 129. A threshold voltage is referred to as 128. When the second bit effect is considered, a logical "1" is to be detected even if the gate-source voltage is higher than the range 126. The excess range is referred to as 127. Therefore the consideration of the second bit effect further reduces the margin window for detecting the state of the memory cell.

To summarize, there are several effects that require that the reference current or voltage for detecting the logical state of a memory cell are more accurate. This is required not only when first operating the memory device but also over its complete lifetime, when degrading effects change the behavior of the memory cells.

Apart from these specific problems there is a general need for high performance, high capacity and high reliability of non-volatile memory devices. In particular, there is a need to have compact non-volatile memory devices. In particular there is a need to have compact non-volatile memory devices that have a memory system that minimizes disturbance effects.

SUMMARY OF THE INVENTION

In one aspect, the present invention provides a non-volatile semiconductor memory device and a respective method for manufacturing and operating a memory device with a better reference scheme. Embodiments of the present invention propose to provide a set of so-called array memory cells, which are arranged in a memory area, and a second set of reference cells, so-called main reference cells, which are situated in a circuitry area.

In one particular example, a non-volatile semiconductor memory device is proposed that includes a memory area and a circuitry area, the memory area comprising a plurality of memory cells arranged in a memory array and a set of programmable array reference cells that are provided as references for reading the memory cells. The circuitry area comprises a set of main reference cells that are provided as references for verifying the state of array reference cells or memory cells.

The main reference cells are provided for setting of the reference cells and for verifying a state of the memory cells. The array reference cells are provided as a reference for reading the memory cells. While the main reference cells are set to a specific state before shipping and therefore before beginning of the regular operation of the memory device, the array memory cells are repeatedly programmed and erased during their lifetime. Therefore, the array memory cells are subjected to the same stress as the memory cells and, therefore, they degrade in the same manner as the memory cells. A movement of the characteristics of the memory cells does not effect reading or programming results since the array reference cell characteristics move in a corresponding manner.

In a first preferred embodiment of the invention, the set of main reference cells comprises a programmed main reference cell and an erased main reference cell. The set of programmable array reference cells comprises array reference cells used for providing a programmed and an erased reference for reading data.

In a second preferred embodiment of the invention, the set of main reference cells also comprises a programmed main reference cell and an erased main reference cell. The set of programmable array reference cells comprises, as the only reference cell or supplementary to other reference cells, a read reference cell provided to have a threshold voltage defining the border between an erased state and a programmed state of a memory cell and which can be used for reading data from the memory cells. It can be set to the specific threshold voltage using the main reference cells as a reference.

In a third preferred embodiment of the invention, the set of main reference cells additionally comprises a read reference cell provided to have a threshold voltage defining the border between an erased state and a programmed state of a memory cell, which is provided as a reference for verifying the state of the read reference cell comprised in the set of array reference cells.

In accordance with another embodiment, a method for operating a memory device comprises the steps of setting at least one array reference cell to a predefined state using at least one of the pre-programmed main reference cells as a reference, reading the state of at least one memory cell using the array reference cells as a reference and verifying the state of at least one memory cell when erasing or programming the memory cell using at least one of the main reference cells as a reference.

In preferred embodiments of the method according to the present invention, the main reference cells and the array reference cells are used as indicated above in connection with the respective memory devices.

An additional advantage of the present invention is that not only array behavior over time of stored information—so-called "retention after-cycling"—is considered but also stress to the cells caused by write cycles. Additionally, environmental conditions such as temperature effects both the reference cells and the memory cells. On the other hand, good reference values are available from the main reference cells. These are not effected by the typical stress to which memory and array reference cells are exposed.

In a further improved embodiment of the invention, for each wordline an additional status cell is provided. In this status cell, named "Row Guard Reference," an information is store by a first logical state indicating if one of the memory cells associated to the respective wordline is programmed. Otherwise all memory cells associated to the word line are erased, which is indicated by the other logical state.

It is a further advantage of embodiments of the present invention that the proposed reference scheme can be applied to all types of volatile memory devices.

These and other advantages of the present invention will become obvious to those of ordinary skill in the art after reading the following detailed description of the preferred embodiments, which is illustrated in the various figures and drawings.

BRIEF DESCRIPTION OF THE DRAWINGS

For a more complete understanding of the present invention, and the advantages thereof, reference is now made to the following descriptions taken in conjunction with the accompanying drawing, in which:

FIG. 4 is a flow diagram showing a method for operating a non-volatile memory device with main reference cells and array reference cells;

FIG. 6 shows a schematic drawing of an array reference cell and a memory cell;

DETAILED DESCRIPTION OF ILLUSTRATIVE EMBODIMENTS

Embodiments of the present invention and embodiments will be described more specifically with reference to the drawings. In the figures, identical or similar components are denoted by identical numerals and their description will not be repeated.

Non-volatile semiconductor memory devices that are electrically re-writable and erasable are referred to as EEPROMs or NROMs as mentioned previously.

Figure 1:
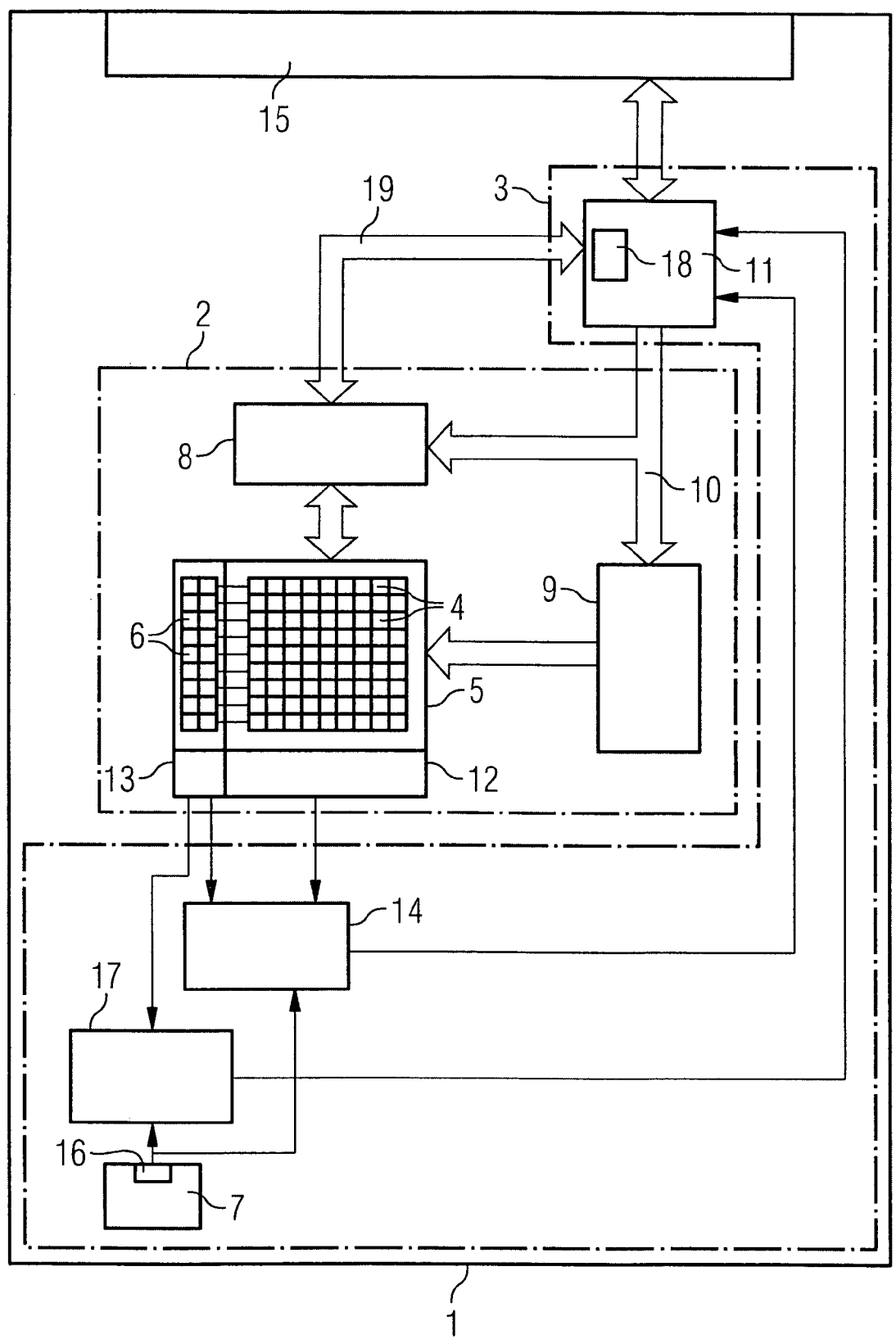
FIG. 1 is a schematic diagram of a flash memory circuit according to the present invention.

FIG. 1 is a block diagram showing a configuration of a flash memory device 1 that uses NROM memory cells for storing data. The memory device comprises a memory area 2 and a circuitry area 3. The memory area 2 comprises a memory array 5 with a plurality of memory cells 4. The memory cells are arranged in columns and rows and, therefore, constitute a matrix. Each of the memory cells can be selected by means of a column decoder 8 and a row decoder 9. Both decoders are connected to an address bus 10, which is also connected to a control unit 11 of the circuitry area 3. The control unit 11 is connected to an I/O-interface for receiving and sending data from an external device. For example, for reading data stored in the memory device the control unit 11 accesses the memory array 5 by sending an address to the column decoder 8 and the row decoder 9. The column decoder 8 extracts information as to which of the bitlines of the memory array 5 are to be selected. The row decoder 9 selects a wordline, corresponding to the address transmitted from the control unit 11. Data are transmitted between the control unit 11 and the memory array 5 over a data bus 19. For reading and writing data, the control unit 11 comprises write and read circuits 18 to perform operations on the memory array 5.

For reading a memory cell, it is necessary to compare a current flowing through that cell with a current flowing through a reference cell. This is done by sense amplifiers 12 and 13. The sense amplifier 12 is a memory cell sense amplifier that is connected to the bitlines of the memory cell 5.

According to embodiments of the invention array reference cells 6 are provided that are connected to the same wordlines as the memory cells 4. In a preferred embodiment of the invention, a set of at least two reference cells are provided for each of the wordlines. During operation of the memory device one of the reference cells is configured to have a threshold value corresponding to an erased state of a memory cell and at least one other reference cell is configured to have a threshold voltage corresponding to a programmed state of a memory cell. Third main and array reference cells can be provided and configured to have a threshold voltage corresponding to an over-erased state of a memory cell. Supplementary array reference cells can be added such as a status cell for indicating if all memory cells of a specified group of memory cells are erased.

The memory cell sense amplifier 12 is provided for measuring a current through the memory cells 4 of the memory array 5. An array reference sense amplifier 13 is provided for measuring a current through the array reference cells 6. An array evaluation circuit 14 is connected to the memory cell sense amplifier 12 and to the array reference sense amplifier 13. By comparing the signals received from the sense amplifiers 12 and 13 a result signal is generated, which indicates a logical state of a selected memory cell.

This procedure for reading the logical state of a memory cell is carried out each time the stored data is requested, for example by a host system, which is connected to the I/O-interface 15 or if the state of a memory cell is to be verified and therefore to be read after an erasing or a programming operation.

In the context of this application, writing means to set the state of a memory cell to an erased or a programmed state. Programming means to set the state to a first logical value and erasing means to set the state to a second logical value.

As mentioned above, it is necessary, especially for highly integrated memory devices, to provide a reference value that is very exact in order to enable a sharp and tight program/erase differentiation. This is particularly important if more than two states are to be detected as is the case using two bit NROM cells.

It is an advantage of the present invention that the reference cells are arranged next to the memory cells that are to be read. They are also treated as normal memory cells and, therefore, exhibit the same behavior in time and during write cycles as memory cells and are subject to the same temperature variations. Also, all other kinds of disturbances effect the reference cells in the same manner as the memory cells. The respective memory cells are connected to the same wordline as the assigned memory cells. Therefore, the selection of a memory cell by activating a wordline also activates the respective array reference cell. This mechanism assures that the current flowing through a memory cell and through a reference cell are measured at the same time.

For providing exact reference values and according to embodiments of the invention, it is proposed to provide a set of main reference cells 7, which are used as a reference for writing reference values to the array reference cells 6. The main reference sense amplifiers 16 are also connected to the array evaluation circuit 14. Therefore, cells of the memory array can also be read or verified using the main references. In general, for reading stored data the array reference cells are used, since these provide references that are degraded in the same manner as the data stored in the memory cells. Additionally, this prevents the main reference cells from further stress, which could degrade the threshold values of the reference cells. The array reference cells and the memory cells assigned to this row can later be refreshed using the references provided by the main reference cells. Thereby the affected cells are set to optimum values.

For setting the array reference values the same mechanism is implemented as already explained for the reading of memory cells. As described above, a current through an array reference cell can be measured by the array reference sense amplifier 13. A current through the main reference cells 7 is measured by main reference sense amplifiers 16. Both sense amplifiers 13 and 16 are connected to main evaluation circuit 17, which compares the values measured by the sense amplifiers 13 and 16 and outputs a signal indicating the logical state of a measured array reference cell 6. In contrast to the setting of memory cells using the array reference cells, the main reference cells and the array reference cells are not connected to the same wordline. The main reference cells are controlled by an additional control signal.

Both the array evaluation circuit 14 and the main evaluation circuit 17 are connected to the control unit 11. For setting an array reference cell 6 to a dedicated state, the actual state is detected by the sense amplifiers 13 and 16 and the main evaluation circuit 17. The state is reported to a write circuit 18 of the control unit 11 and, if necessary, a write operation is performed. After writing data to the array reference cell, a read operation is performed to verify if the write operation was sufficient to reach the state as required.

In the embodiment according to FIG. 1 two sense amplifiers 12 and 13 are provided for evaluating the state of a memory cell 4 or an array reference cell 6. Both sense amplifiers 12 and 13 are connected to an evaluation circuit 14 for generating a signal corresponding to the detected logical state. Other kinds of sense amplifiers are available, which directly compare the measured currents through the memory cell or the array reference cell, respectively, and generate a corresponding output signal. The invention can be applied independent from the used sense amplifiers so that all kinds of sense amplifiers can be used.

Figure 2:
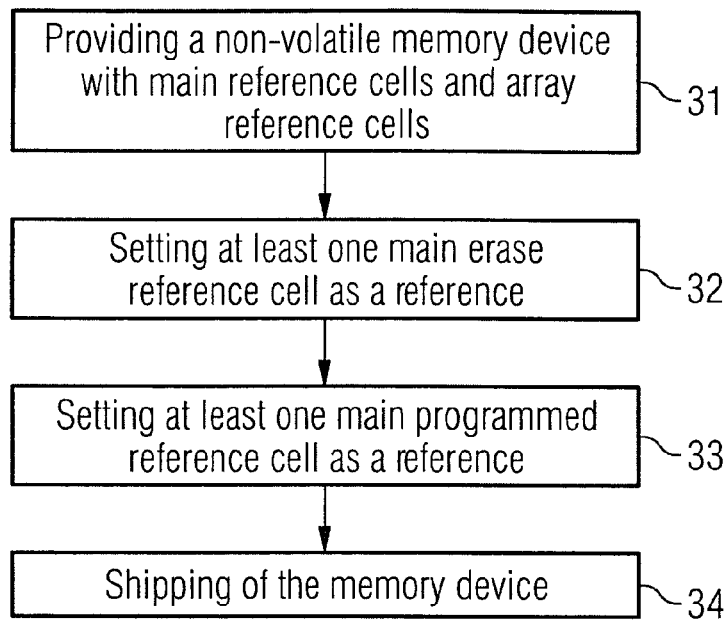
FIG. 2 is a flow diagram of a method according to the present invention.

FIG. 2 is a flow diagram describing the process of manufacturing a non-volatile memory device according to embodiments of the present invention. In step 31 a non-volatile memory device is provided that comprises a plurality of memory cells arranged in a memory array, at least two array reference cells that are programmable to have a threshold voltage corresponding to an erased state or to a programmed state respectively, and at least two main reference cells that are programmable to have a threshold voltage corresponding to an erased state or to a programmed state, respectively. Such a memory device corresponds to the one that is described in FIG. 1 as a possible example.

In step 32 an erased main reference cell is set to a threshold voltage corresponding to an erased state of a memory cell. In the case of an NROM cell, this is done by the mechanisms described above. More precisely it is done by erasing the respective main reference cell and afterwards verifying if the threshold voltage fulfills the requirements defined by the manufacturer.

In step 33 the same is done for another main reference cell that is later used as a reference for programming or reading array reference cells or memory cells.

In a further step 34 the memory device is shipped, for example to a customer. The writing of reference values to the main reference cells can best be done during wafer sorting. However, it is also possible to set the main reference cells to the predefined threshold voltages when testing the non-volatile semiconductor memory device, as illustrated in FIG. 3.

Figure 3:
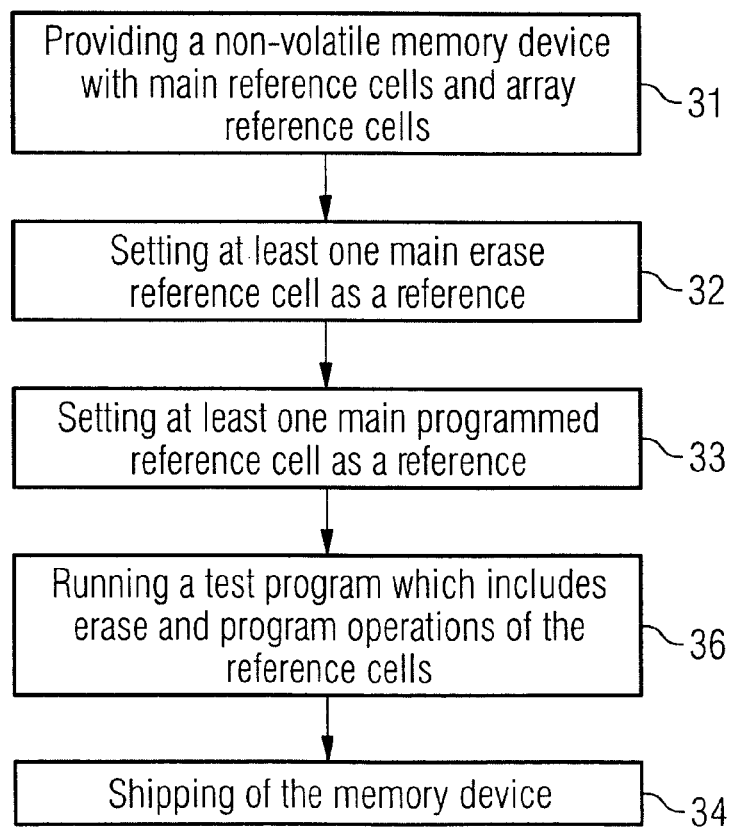
FIG. 3 is a flow diagram which shows a method for providing a non-volatile semiconductor memory through a manufacturer.

According to the diagram of FIG. 3 a test program is performed after setting of the main reference cells. The test program includes erase and program operations carried out for the main reference cells.

After finalizing the test program the main reference cells are not cycled anymore. That means that no write operations are performed on the main reference cells. They are only used in read operations but this does not substantially speed up the degrade process of the main reference cells. Therefore, the main reference cells provide an exact reference during the entire lifetime of a non-volatile memory device.

When operating a non-volatile memory device according to embodiments of the invention the array reference cells must be set to appropriate threshold values to serve as references for programming and reading memory cells of the memory array as shown in FIG. 4. In step 31 a non-volatile memory device is provided with main reference cells, which are set to the reference values before shipping. In steps 41 and 42 array reference cells are set to a programmed and an erased state, respectively, for later reading or programming of memory cells of the memory array (step 43).

The array reference cells for providing an erase reference are set to an erased threshold value by first erasing the cells and afterwards verifying if the threshold values fulfill the requirements defined for an erased cell. For this step the erased main reference cell is used as a reference (step 41).

In step 42 the same is done for other array reference cells that are set to a programmed state using the programmed main reference cell as a reference.

After conducting these steps, in step 43 the memory cells can be read or written. For reading memory cells the actual cell current can be compared with multiple reference currents to find out in which state a memory cell is. Also, it is possible to generate a comparative current from the erased array reference cell current and the programmed array reference cell current and to compare the actual cell current with the comparative current.

The behavior of memory cells changes in time and after many read cycles. The first criteria means that the memory cells lose charge after a long time. This is called "Retention after Cycling (RAC)." The change of behavior after many write cycles is called endurance. As described above, it is an advantage of the invention that the array reference cells, which are used for reading the memory cells, are subject to the same stress as the memory cells themselves. However, for achieving good reading or writing results it is necessary to cycle the reference cells. This is done by writing reference cells and reading reference cells as it is done with normal memory cells, too. It is one aspect of the invention to provide a method of how to ensure that a refresh of the reference cells is done on a regular basis.

Figure 5A:
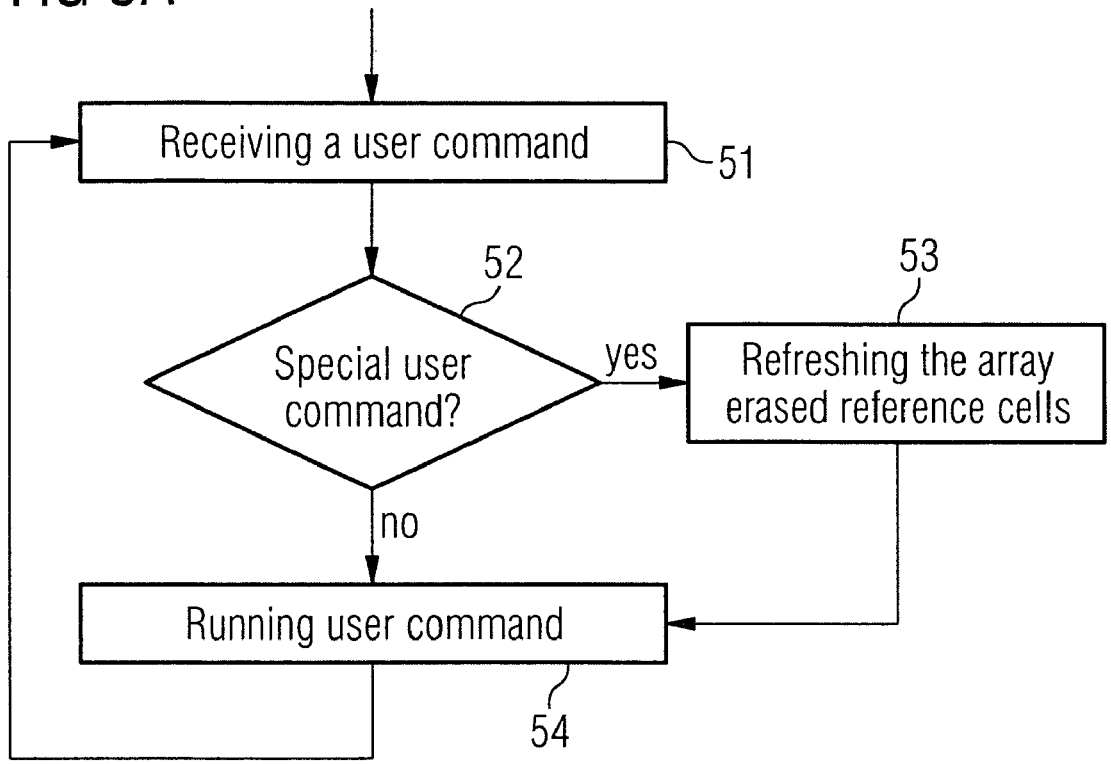
FIG. 5A shows a flow diagram referring to refreshing of an erased array reference cell.

According to the flow diagram shown in FIG. 5A, the refreshing of erased array reference cells can be coupled to the call of predefined user commands. In a first step 51 a user command is received. In a memory device this is done by a control unit as shown in FIG. 1. In a further step 52 it is checked if the received command is one of predefined special commands. If this is the case, the erased array reference cells are refreshed and afterwards the user command is carried out in step 54. If, in step 52, it was detected that the received command is not a special user command, the command is directly carried out in step 54. After the respective operations, the method continues with step 51, which is to wait for a new user command.

Figure 5B:
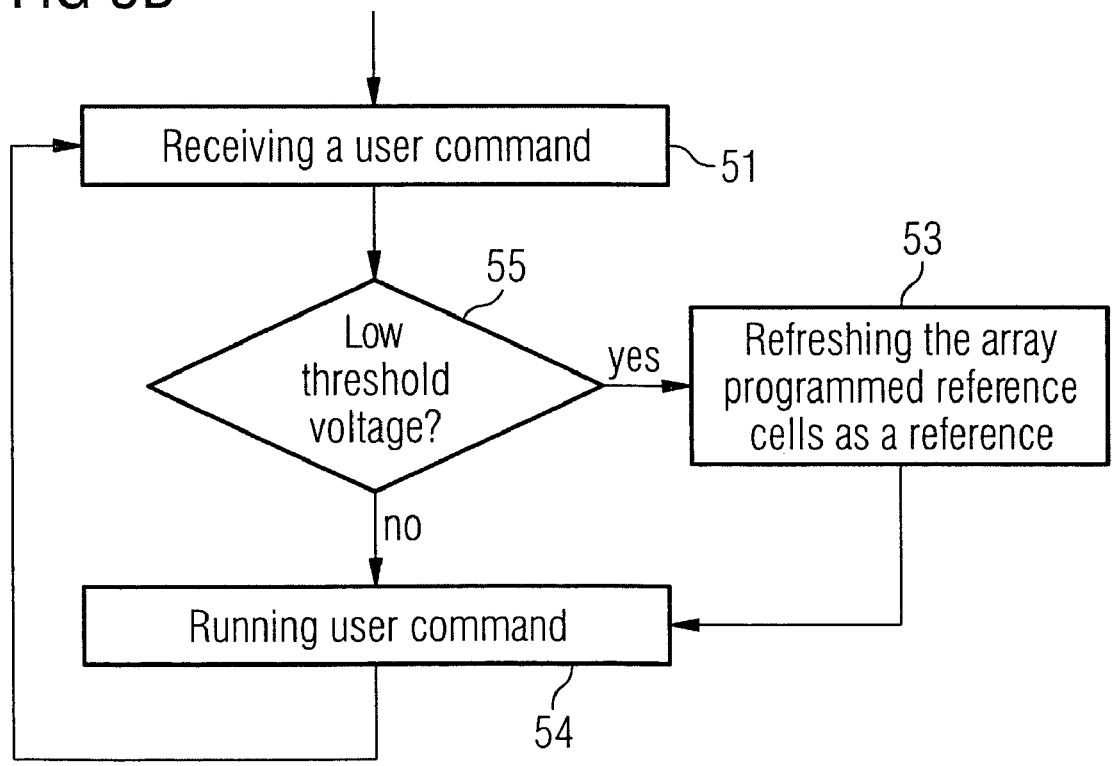
FIG. 5B is flow diagram referring to refreshing of a programmed array reference cell.

FIG. 5B is a flow diagram that refers to a modified procedure for refreshing programmed array reference cells. In step 51 a user command is received. In step 55 it is tested if the actual threshold voltage of the programmed reference cell is low with respect to the main program reference voltage. If this is the case, the programmed reference cells of the array are first refreshed. If not, the user command is directly carried out.

FIG. 6 is a schematic of an exemplary circuit diagram, which shows a main array reference cell 6 with an assigned sense amplifier 13 and also a memory cell 4 of the memory array 5 with an assigned sense amplifier 12. The array reference cell 6 and the memory cell 4 are assigned to the same wordline 61. Therefore, the selection of the memory cell 4 also selects the array reference cell 6. Using the wordline 61 the gates of the transistors 6 and 4 are biased. For selecting the memory cells 6 and 4, which are formed by the shown transistors, the respective bitlines 75 and 77 are also to be selected. This is done by decoders 63 which are the column decoders. If all switch transistors of the decoder 63 are closed, the voltage at node 67 of the array reference cell is applied to the drain of transistor 6 and the voltage at node 69 of the memory cell is applied to the drain of transistor 4.

After closing the switches of the decoder 63 a current $I_{CELL-REF}$ starts flowing from the node 67 over the drain and source of the transistor 6 to ground node GND. The current $I_{CELL-REF}$ depends on the conductivity of the channel from the drain to the source electrode of the transistor 6. The conductivity depends on the charge that is situated on the nitride layer of the memory cell 6, which is an NROM cell in this embodiment of the invention. In other words, the current depends on the state of the memory cell 6, if the voltage at node 67 is constant. For this purpose, a control amplifier 62 is provided that receives at an input the voltage at node 67. The control amplifier 62 controls a further transistor 73 that is connected between node 67 and node 68. Node 68 is also connected to an input of a comparator 65 and a current source 71, which is adjusted to a reference current $I_{REF}$. By the control amplifier 62 it is assured that the voltage at node 67 is kept constant, independent of the cell current $I_{CELL-REF}$. Other embodiments of a sense amplifier are possible and subject to the ordinary skills of a person familiar with any kind of memory devices.

The voltage at node 68 depends on the current $I_{CELL-REF}$ and the reference current $I_{REF}$. If the current $I_{CELL-REF}$ is higher than the current $I_{REF}$, the comparator 65 outputs a HIGH-signal, otherwise it outputs a LOW-signal. Each of the comparators 65 and 66 has another input to which a reference voltage V_REF is applied. Voltage V_REF is used as a comparative voltage for the voltages at node 68 or 70, respectively. It is sized properly according to the dynamic of nodes 68 and 70.

When the memory cell 4—which is shown as an example for a plurality of memory cells—is read by applying an appropriate gate voltage to the memory cell 4, the cell current I_CELL rises due to an increased conductivity of the memory cell 4. This happens under the precondition that the drain-source voltage, which is the voltage at node 69, is kept constant. This is done by sensing the voltage at node 69 and controlling the gate voltage of transistor 74 in order to increase its conductivity. Since the current source 72 remains unchanged, the voltage at node 70 decreases.

If the gate voltage applied to the memory cell is high enough, the cell current I_CELL becomes greater than a threshold, the voltage at node 70 falls under the voltage V_REF and the comparator 66 flips.

The same procedures happen for the reference cell 76, which is in FIG. 6 connected to the same wordline. Assuming that the gate voltages of the memory cell 4 and the reference cell 76 is varied, i.e., linearly increased, both the reference cell comparator 65 and the memory cell comparator 66 will flip but at different times. The information which comparator flips first is indicative of the state of the memory cell.

The circuit of the memory cell and the assigned sense amplifier 12 works in the same way. From this part of the circuit arrangement information about the state of the memory cell is obtained.

Figure 7:
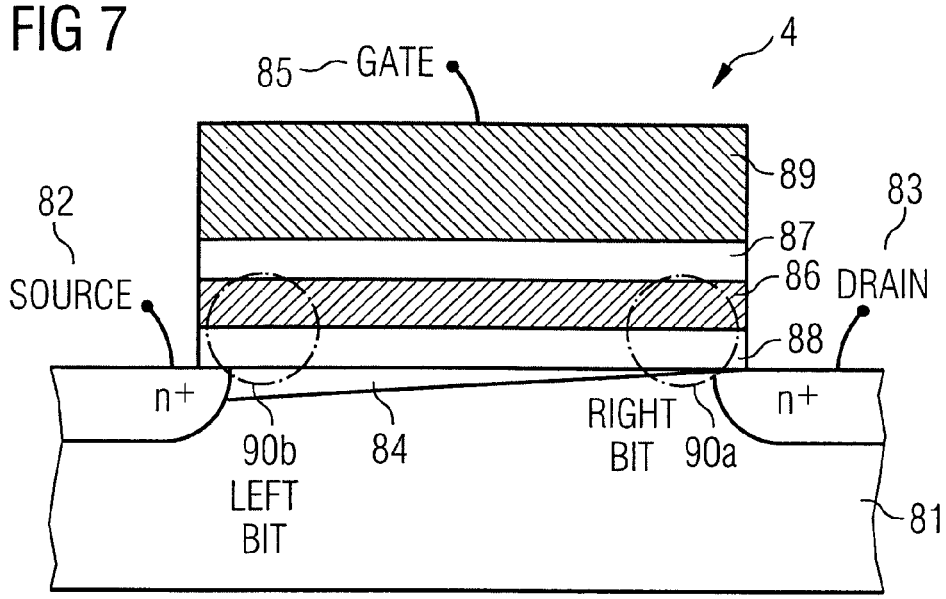
FIG. 7 is a schematic drawing of a NROM memory cell.

As mentioned above in a preferred embodiment of the invention, the memory cells are NROM (nitride read-only memory) cells. A principle set-up of an NROM cell is shown in FIG. 7. A principle understanding of such a device is useful for the understanding of some aspects of the invention that are described below. Illustrated in FIG. 7 is a cross-section of a conventional oxide-nitride-oxide EEPROM memory cell. The memory cell, generally referenced 4, comprises a p-type silicon 81, two pn-junctions between n+ source and drain regions 82 and 83 and p-type substrate 81, a non-conducting nitride layer 86 sandwiched between two oxide layers 87 and 88 and a polycrystalline conducting layer 89.

To program the cell, voltages are applied to the drain 83 and the gate 85 while the source 82 is grounded. For example 10V is applied to the gate and 9V is applied to the drain. These voltages generate a vertical and lateral electrical field along a length of the channel from the source to the drain. This electric field causes electrons to be drawn off the source and begin accelerating towards the drain. As they move along the length of the channel, they gain energy. If they gain enough energy they are able to jump over the potential barrier of the oxide layer 88 into the silicon nitride layer 86 and become trapped. The probability of this occurring is at its highest in the region of the gate next to the drain 83 defined by a dashed circle 90a because it is near the drain that the electrons gain the most energy. These accelerated electrons are termed hot electrons and once injected into the nitride layer they become trapped and remain stored there. The trapped electrons cannot spread through the nitride layer because of the low conductivity of the nitride layer and the low lateral electric field in the nitride. Thus, the trapped charge remains in a localized trapping region in the nitride typically located close to the drain.

Similarly, the left bit is programmed by applying programming voltages to the gate 85 and source 82, which now functions as the drain for the left bit. Hot electrons are injected into and trapped in the charge-trapping layer 86 in the region defined by the dashed circle 90b. The threshold voltage of the portion of the channel under the trapped charge comprising the left bit increases as more and more electrons are injected into the nitride layer.

A more detailed description of how an NROM cell works is given in U.S. Pat. No. 6,011,725, which is incorporated herein by reference. The principle of how more than one bit can be programmed in a one-transistor cell is described in U.S. Patent Publication No. 2002/0118566, which is incorporated herein by reference.

Figure 8A:
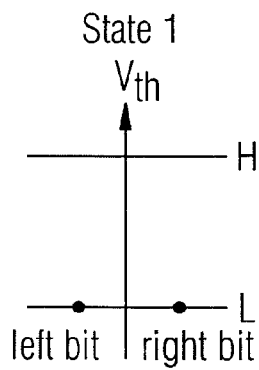
FIGS. 8A to 8D show different states of a two-bit NROM cell.
Figure 8B:
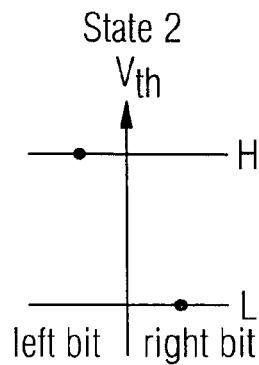
Figure 8C:
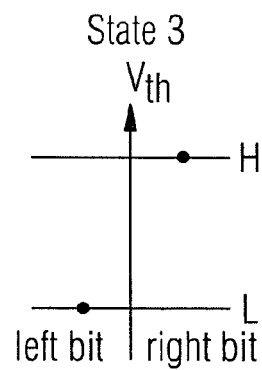
Figure 8D:
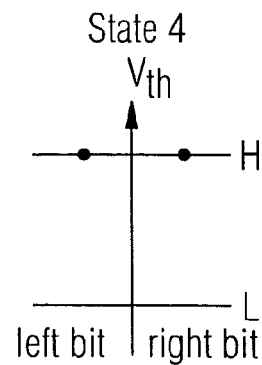

To summarize, in FIGS. 8A to 8D the different possible states are illustrated. It is possible to distinguish between a left bit and a right bit as is also illustrated in FIG. 7 where the set-up of the memory cell is shown. In FIG. 8A both bits of the memory cell are in a LOW state. In FIG. 8B the right bit is in a HIGH state and the left bit is in a LOW state. In FIG. 8C a situation is shown in which the left bit is in a HIGH state and the right bit is in a LOW state. According to FIG. 8D both bits are in a HIGH state.

Figure 9:
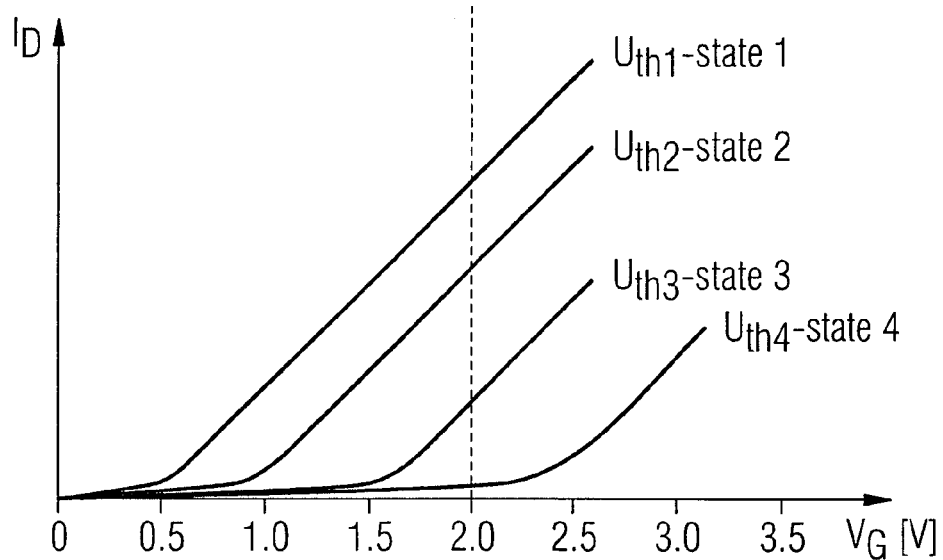
FIG. 9 shows a diagram illustrating the connection between the voltage $V_G$ and the current $I_D$ for different states of the memory cell.
Figure 10A:
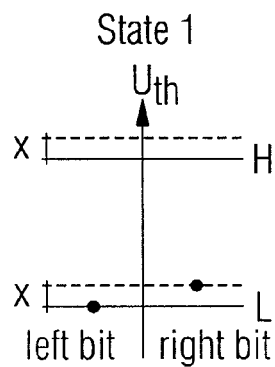
FIGS. 10A to 10D show different states of a memory cell under consideration of the second bit effect.
Figure 10C:
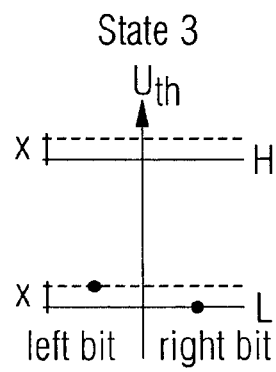
Figure 10B:
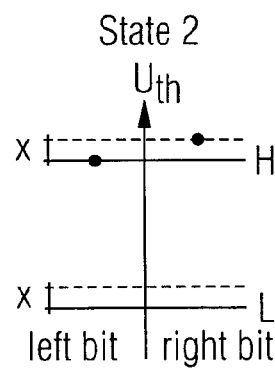
Figure 10D:
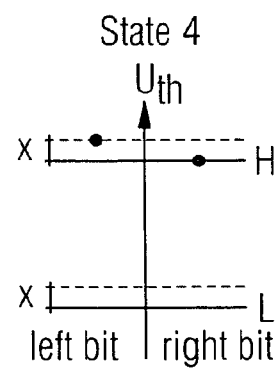

When measuring the current through the cell at a certain gate voltage $V_G$ and depending from the actual threshold voltage different currents $I_D$ can be measured as shown in FIG. 9. For example, at a gate voltage of 2V, four different currents can be measured. Therefore, it can be detected to which state the measured current belongs.

The programming of neighbor bits also influences the threshold voltage of the other bit which should, for example, be kept on the low level. This effect appears since the second bit affects not only the read operations but also the verify operations that occur during the writing, e.g., erasing or programming the array. A verify operation is a read operation performed during write operations and assesses a need of a program or erase pulse to properly write the intended data. The second bit effects the verify result and, therefore, the programming behavior of the cell. Considering this effect, the states as shown in FIGS. 8A to 8D are extended as shown in FIGS. 10A to 10D.

In a future scenario where more than two bits are stored in one memory cell the situation will become more difficult since further states according to more different threshold voltages must be detected.

Figure 11:
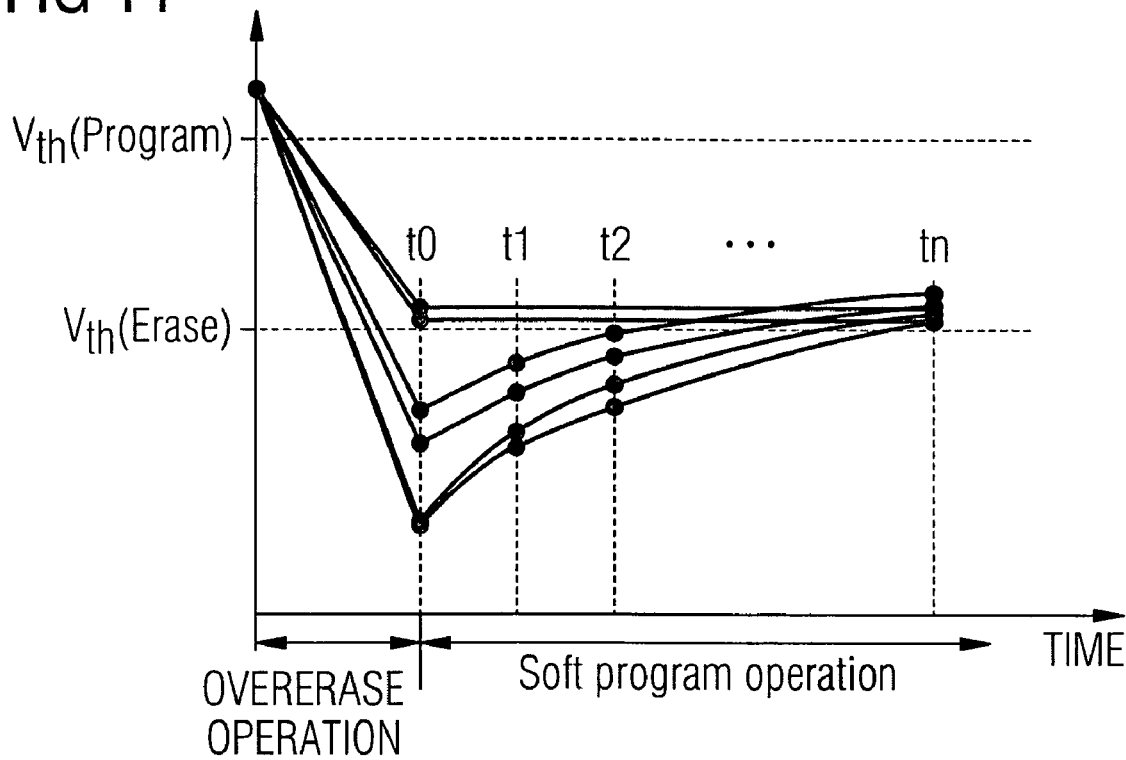
FIG. 11 is a graph representing a variation with time of a threshold voltage $V_{TH}$ of each memory cell resulting from an over-erase operation and a soft-programming and verifying operation performed for a cell.
Figure 12:
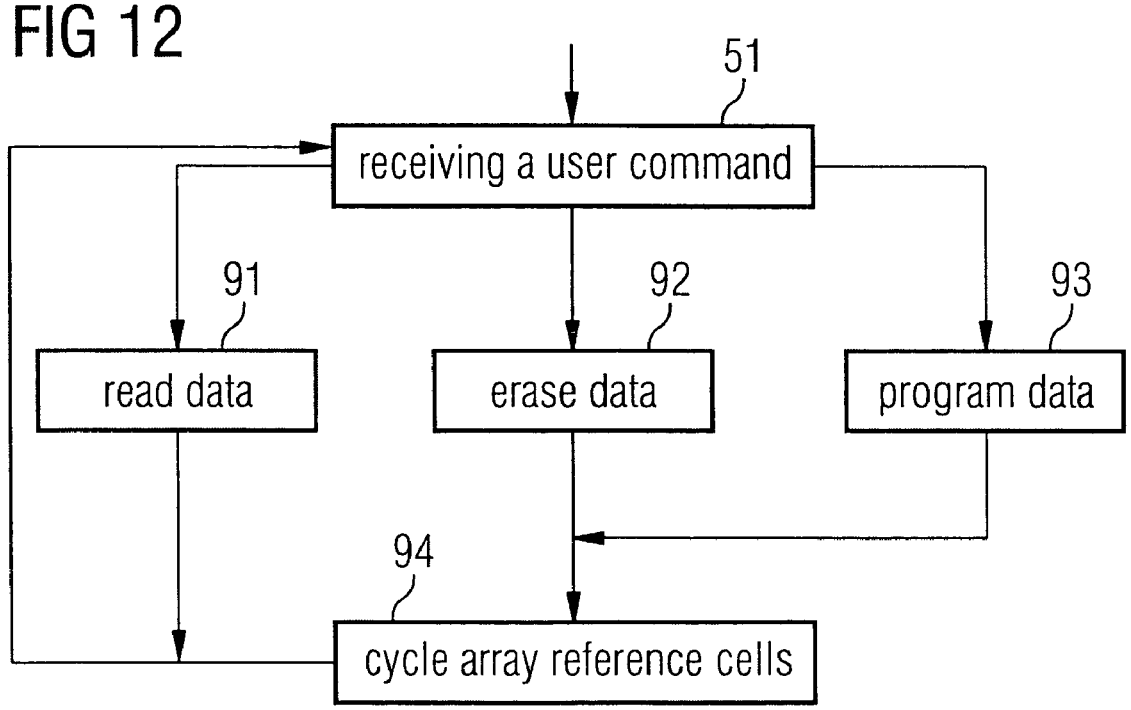
FIG. 12 is a flow diagram relating to the cycling of reference cells.

Also, to aid understanding of additional aspects of the invention, it is explained what an over-erased state of a memory cell is. Referring to FIG. 11 which shows threshold voltages of several reference or memory cells, it can be seen that a threshold voltage of a memory cell comprises a programmed level $V_{TH(PROGRAM)}$ and an erased level $V_{TH(ERASE)}$. For a programmed state of a memory cell the threshold voltage $V_{TH}$ is brought to a level higher than the programmed level. For an erased state the threshold voltage is reduced to a level marginally higher than the erased level. When getting from the programmed state to the erased state it might happen that the threshold voltage drops below the erased level $V_{TH(ERASE)}$. This state is called an "over-erased state." One reason for the occurrence of the over-erased state is that multiple memory cells are commonly erased but the behavior of these cells is different. While one cell is reaching the erased state, another cell is already over-erased. Another exemplary reason is an erase operation conducted to a neighbor cell leads to a loss of charge. A soft program operation, also called refresh operation, carried out for each cell that is in the over-erased state assures that the threshold voltage of all cells is adjusted to the erased state. This does not change the logical state of the cell but the actual threshold voltage is adjusted to a proper value according to the threshold voltage of the erased reference cell.

FIGS. 12 to 15 are used to describe how it can be assured that the array reference cells are subject to the same stress as the memory cells. This can be achieved if after each erase or program data operation, the reference cells are also cycled, that means that they are erased or programmed. In step 51 of FIG. 12 a user command is received. When it is a read command read data operations are performed in step 91. If it is an erase command, the operations according to step 92 are performed. After carrying out the operations of step 92 at least some of the array reference cells are cycled in step 94. The same happens when a program command is received. In this case operations according to step 93 are performed and afterwards at least some of the reference cells are cycled in step 94. Alternatively, the cycling of reference cells according to step 94 can be carried out simultaneously to the erasing or programming of memory cells as indicated by the dashed arrow. The array reference cells are not used for erasing or programming. Verify operations that are necessary when erasing or programming memory cells are conducted using the main reference cells as references.

Figure 13:
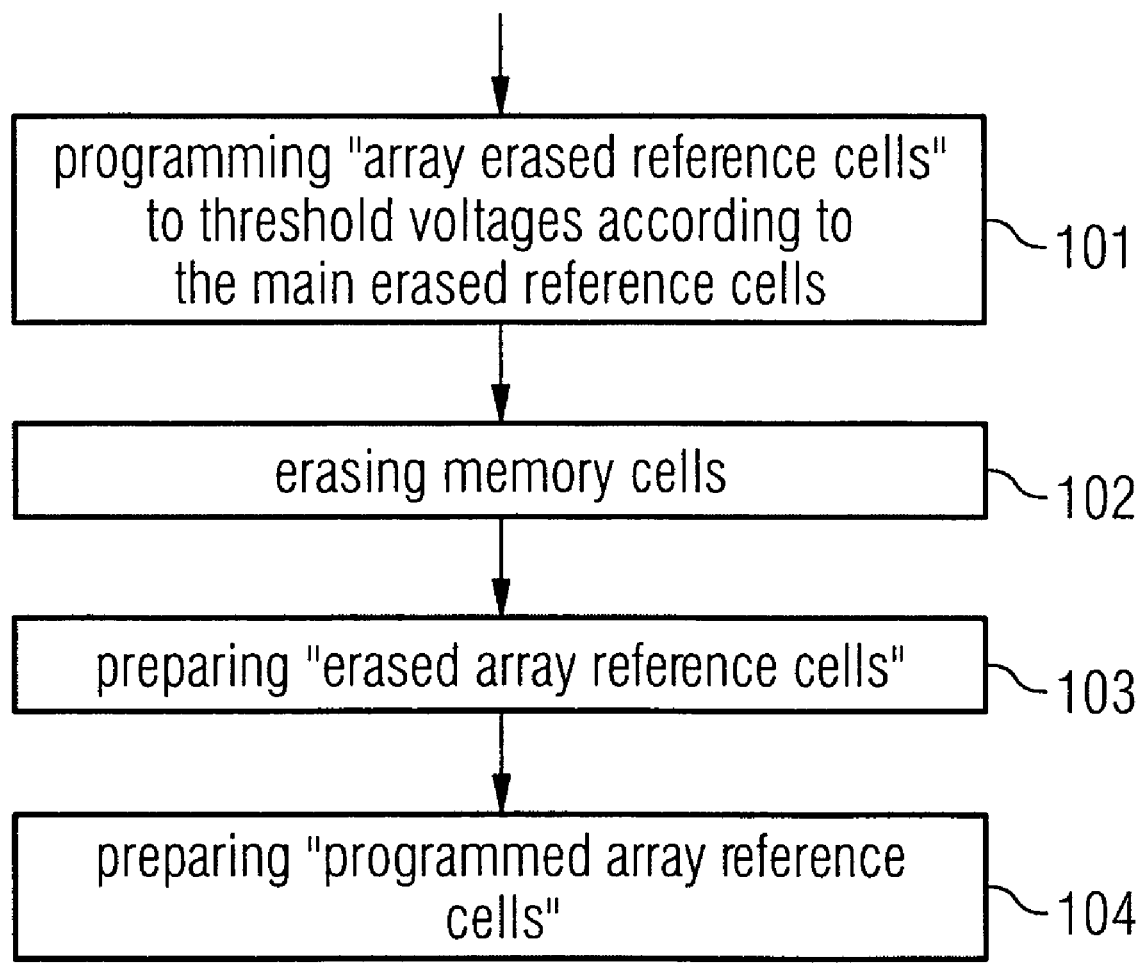
FIG. 13 is a flow diagram illustrating a block erase command.

In FIG. 13 it is illustrated how a block erase command works. First, all erased array reference cells are programmed in step 101 to have a threshold voltage according to the erased main reference cell. In a following step 102 the memory cells are erased using the erased array reference cells as a reference.

In step 103 the erased array reference cells are prepared for later reading operations. Then also the programmed array reference cells are prepared in step 104 for later reading operations.

In an alternative implementation of a block erase, command steps 103 and 104 are not subsequently carried out after erasing the memory cells in step 102. The alternative embodiment is realized when a status cell or a status bit is used to indicate that all memory cells of a predefined group are erased. Such a group can be constituted by all memory cells and reference cells connected to the same wordline. When launching a block erase command all these cells, the reference cells and the status cell are erased. Before reading data the reference cells must be set to appropriate values, i.e., to an erased and a programmed state if the respective cells are provided. The "erased array reference cell" must be set to a "bad" reference value according to step 103 and the "programmed array reference cell" must be programmed according to step 104. This can also be done before programming the first bit after a block erase command as is described below with reference to FIG. 15 and FIG. 16.

Figure 14:
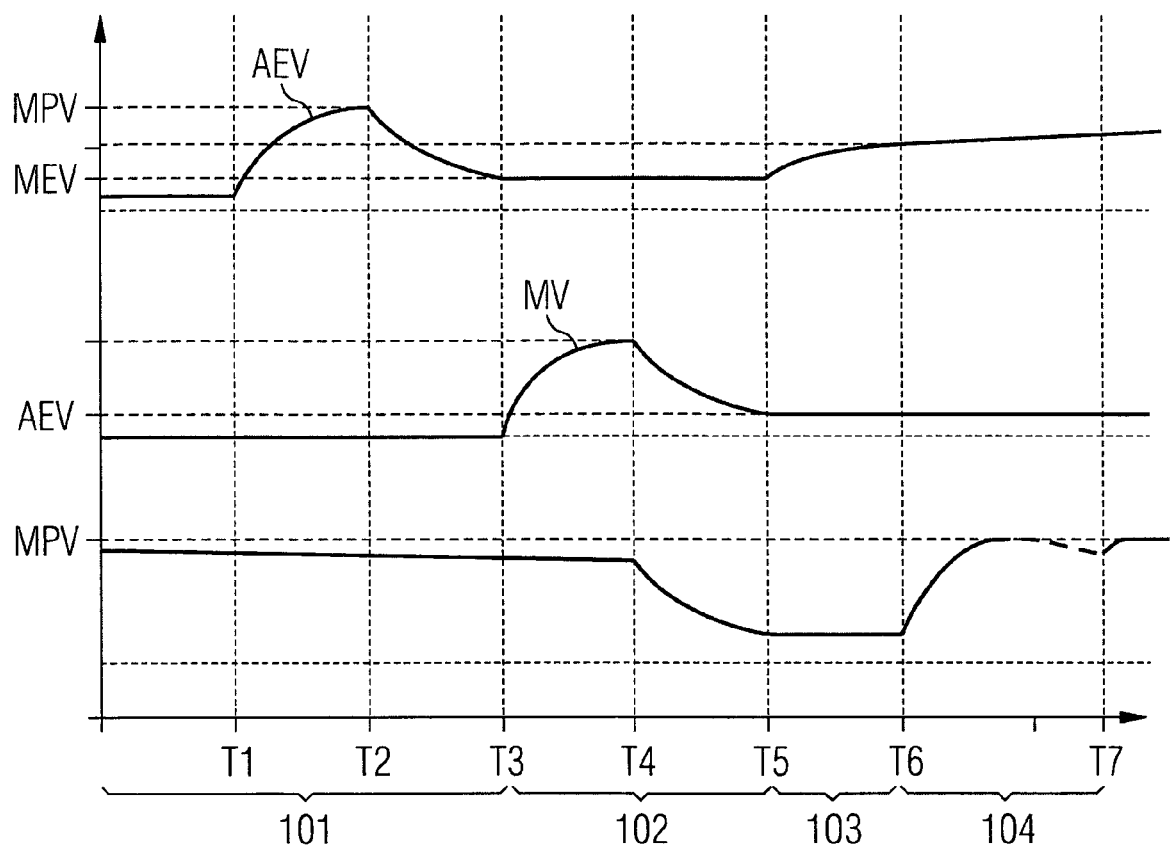
FIG. 14 is a graph representing a variation with time of the threshold voltage of an erased reference cell, a programmed reference cell and a memory cell.

FIG. 14 helps to explain how this works in detail. FIG. 14 is a time diagram showing the threshold voltages of the erased array reference cell, the programmed array reference cell and a memory cell.

At time T1, step 101 starts and erased reference cells are preprogrammed up to the main program reference threshold voltage MPV. At time T2, the erased array reference cells are erased till they reach the main erase reference threshold voltage MEV.

At time T3, step 102 starts. First the memory cells are preprogrammed to a higher threshold voltage and then, at moment T4, the memory cells are erased to the erased main reference threshold voltage MEV defined by the erased main reference cells.

At time T5, step 103 starts preparing the erased array reference cells for reading data. That means that a worst-case erased reference is generated including the second bit effect. By this operation the threshold voltage of the erased array reference cells rises.

At time T6, step 104 starts with the preparing of the programmed array reference cells for reading data. This is done by increasing the threshold voltage to a main program reference threshold voltage MPV. After some time the threshold voltage decreases and, therefore, a refresh is needed. The refresh is necessary because, for example, block erase operations or program operations carried out for other cells have an impact on neighboring cells, which leads to charge loss. Also, the reference cells are affected. Refreshing the programmed array reference cells ensures that charge loss is compensated for.

As indicated above, the method as it is described referring to FIGS. 13 and 14 is an example. For reliability reasons it is better to prepare the array reference cells when programming data to the memory cells.

Figure 15:
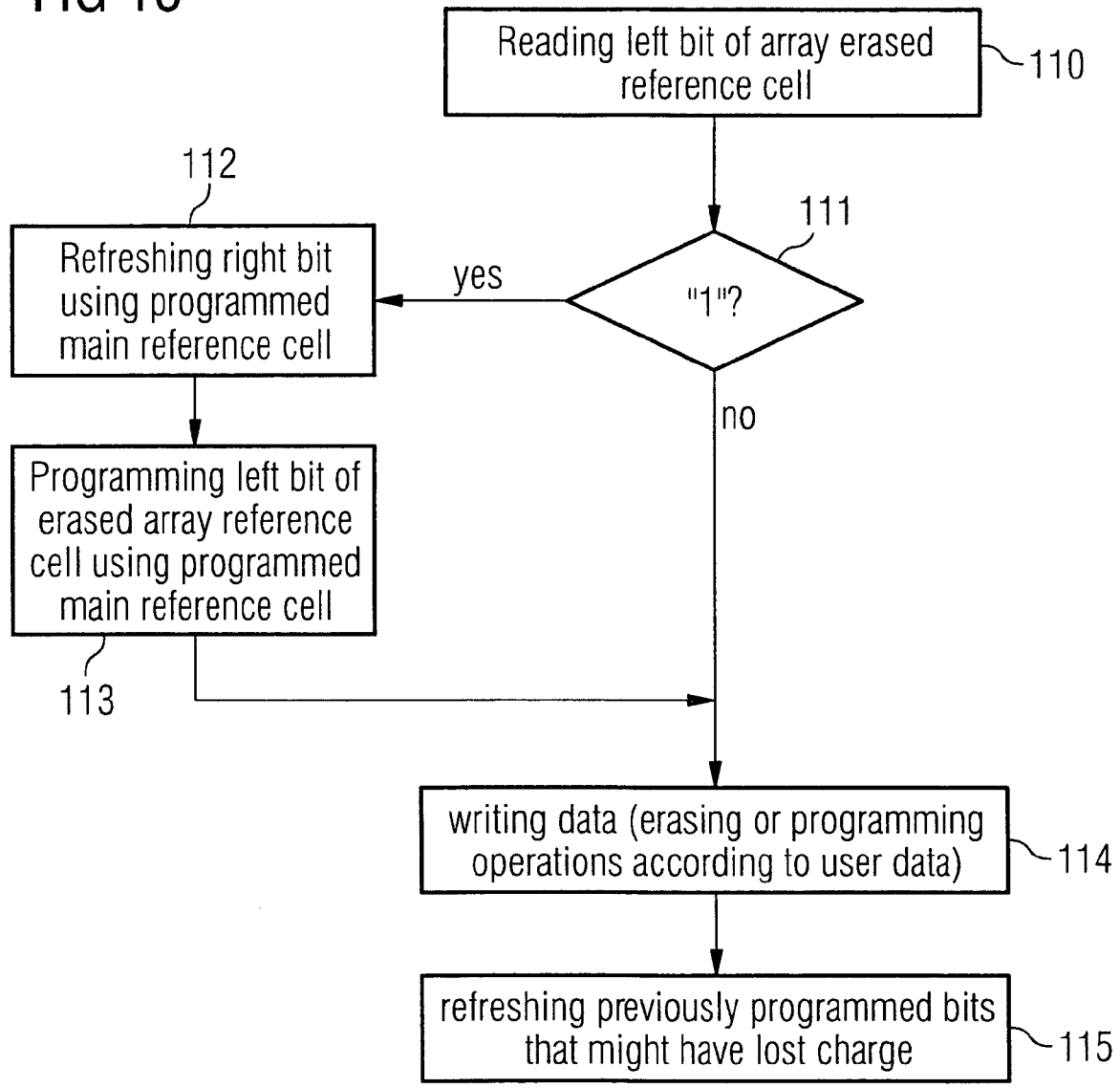
FIG. 15 is a flow diagram relating to a word program command.

FIG. 15 shows another flow diagram for a word program command. Before writing data the left bit of the programmed array reference cell is read in a step 110. Usually, as done by convention in this embodiment of the invention, the right bit of the reference cell is used for storing the reference value. The state of the left bit gives the information if bits were previously programmed on this wordline. If the left bit is a logical "1", as checked in a step 111, this means that no bit was previously programmed on this wordline. Therefore, in step 112 a refreshing operation of the right bit using the programmed main reference should be performed. Refreshing, also called soft programming, means that the threshold voltage is verified and if necessary set to a new level, while the logical state of the cell remains the same. This is different from a programming operation that changes the logical state from erased to programmed or the erase operation that changes the logical state of a cell from programmed to erased.

After refreshing the right bit, a programming of the left bit is done in step 113. Since the left bit is now programmed it can be recognized that a bit was written on this wordline when a word program command is executed next time.

After programming the left bit in step 114, data can be written to the memory cells according to the user data. In a following step 115 a refreshing of previously programmed bits that might have lost charge is performed.

Figure 16:
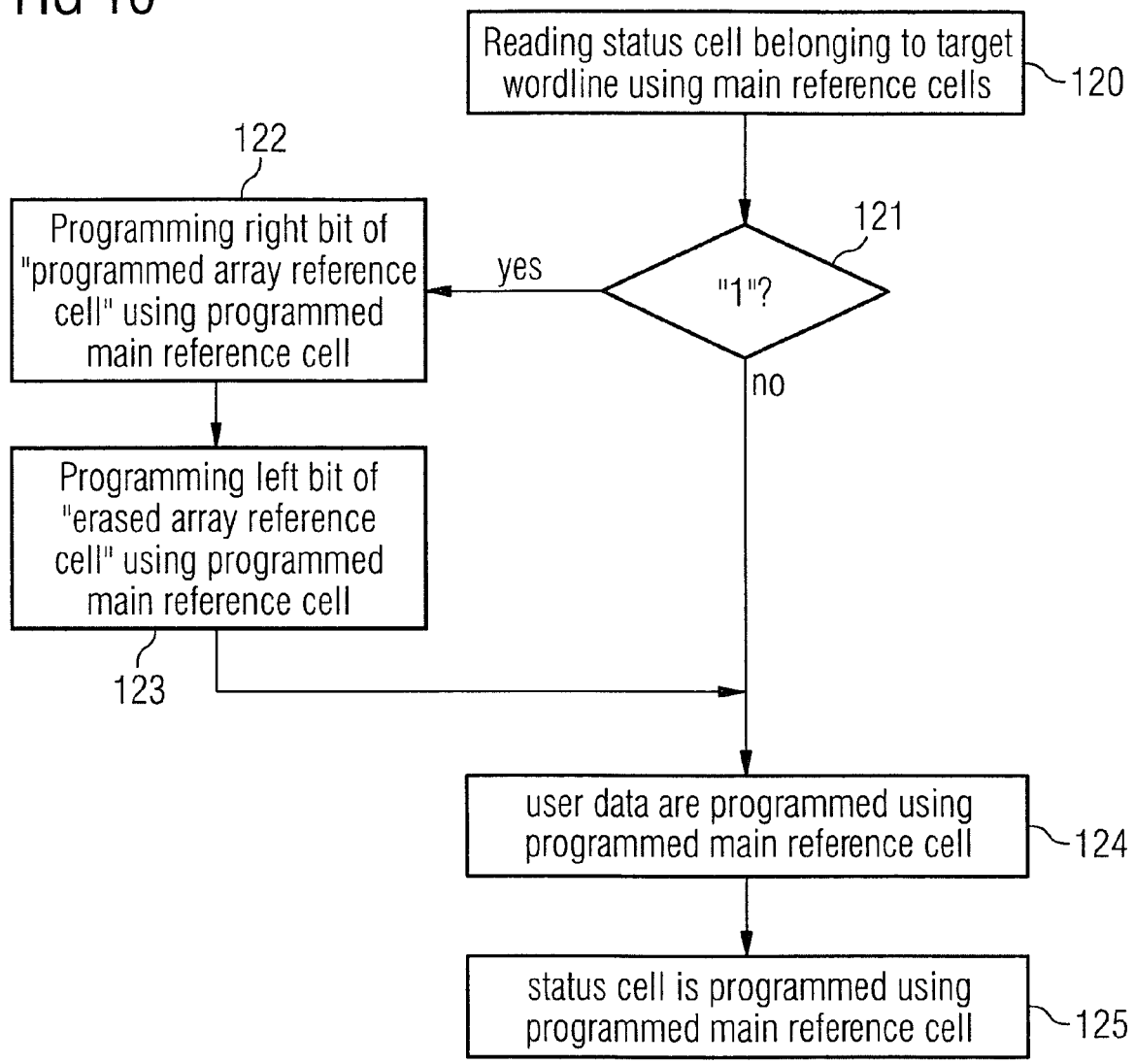
FIG. 16 is a flow diagram relating to an alternative implementation of a word program command.
Figure 17:
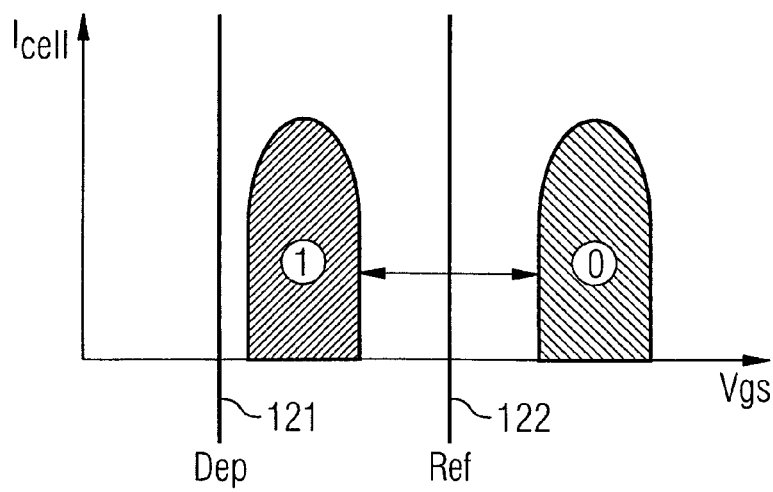
FIGS. 17, 18 and 19 are diagrams showing the necessity of sharp reference voltages.
Figure 18:
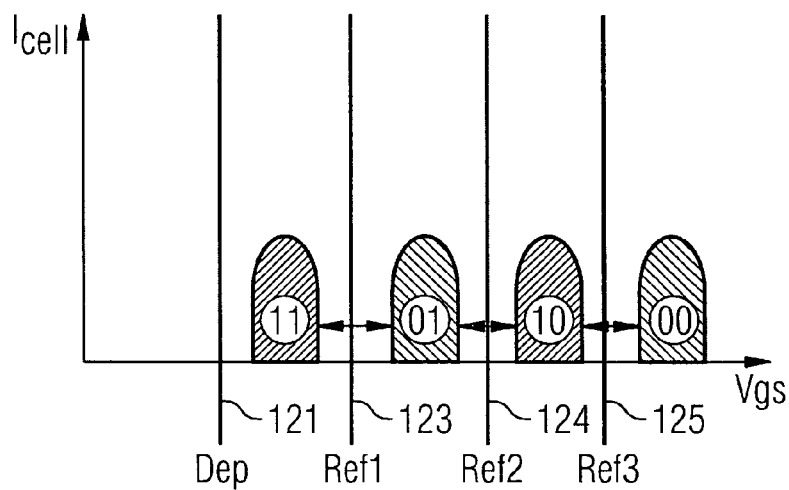
Figure 19:
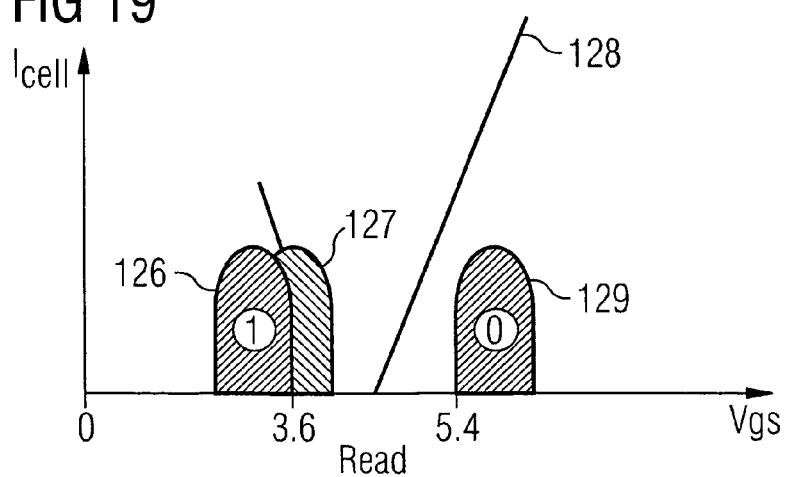

FIG. 16 shows another example of detecting if a bit was previously programmed on a wordline. In the illustrated example the above-mentioned row guard reference is used to store the required information. If all memory cells connected to the wordline are erased, the row guard reference cell is also erased. When reading a logical "1" from the row guard cell, which is done in step 120 using the main reference cells as a reference, the array evaluation circuit 14 knows (step 121) that prior to programming data the programmed array reference cell must be programmed and verified using the programmed main reference cell (step 122). Thereby a programmed array reference is provided. To provide a "bad" erased array reference, i.e., also degraded memory cells should be properly identified as to be erased, the neighbor bit, which is the left bit of the erased array reference cell, is programmed in step 123.

Afterwards data can be programmed and verified in step 124 using the erased array and programmed reference cells. In step 125 the row guard reference cell is programmed to indicate that at least one bit has been programmed on that wordline. Optionally, an erased array reference cell trimming for amending the right bit charge of the erased array reference cell is performed in step 126.

Other embodiments of the invention are subject to the knowledge of a person with ordinary skills in the art. Therefore, they are covered by the invention as claimed.

What is claimed is:

1. A non-volatile semiconductor memory device comprising:
   a memory area and a circuitry area different from said memory area, wherein said memory area comprises:
   a plurality of memory cells arranged in a memory array; and
   a set of programmable array reference cells that are provided as references for reading said memory cells, and wherein said circuitry area comprises:
   a set of main reference cells that are provided as references for verifying a state of the array reference cells or the memory cells, a first one of said set of main reference cells for verifying a programmed state, and another one of said set of main reference cells for verifying an erased state.

2. The non-volatile semiconductor memory device according to claim 1, wherein said memory cells comprise multi-bit memory cells.

3. The non-volatile semiconductor memory device according to claim 2, wherein each memory cell comprises a transistor having an electric charge-trapping layer capable of storing two binary information bits.

4. The non-volatile semiconductor memory device according to claim 3, wherein said electric charge-trapping layer of said transistors is made of a nitride material.

5. The non-volatile semiconductor memory device according to claim 2, wherein each array reference cell comprises a transistor having an electric charge-trapping layer capable of storing two binary information bits, one of these bits defining the logical state of the reference cell.

6. The non-volatile semiconductor memory device according to claim 1, wherein the memory device is configured to be operated in a test mode in which a setting of said main reference cells to a programmed or erased state is enabled; and
wherein a setting of the main reference cells to a programmed or erased state is disabled after leaving the test mode.

7. A non-volatile semiconductor memory device comprising:
a memory area and a circuitry area, wherein said memory area comprises:
a plurality of memory cells arranged in a memory array;
a set of programmable array reference cells that are provided as references for reading said memory cells, and wherein said circuitry area comprises:
a set of first main reference cells, said first main reference cells provided to have a threshold voltage corresponding to a programmed state of a memory cell; and
a set of second main reference cells, said second main reference cells provided to have a threshold voltage corresponding to an erased state of a memory cell, and wherein said set of programmable array reference cells comprises:
a first array reference cell provided to have a threshold voltage corresponding to a programmed state of a memory cell; and
a second array reference cell provided to have a threshold voltage corresponding to an erased state of a memory cell.

8. A non-volatile semiconductor memory device comprising:
a memory area and a circuitry area, wherein said memory area comprises:
a plurality of memory cells arranged in a memory array;
a set of programmable array reference cells that are provided as references for reading said memory cells, and wherein said circuitry area comprises:
a set of first main reference cells, said first main reference cells provided to have a threshold voltage corresponding to a programmed state of a memory cell; and
a set of second main reference cells, said second main reference cells provided to have a threshold voltage corresponding to an erased state of a memory cell, and wherein said set of programmable array reference cells comprises:
a read reference veil provided to have a threshold voltage defining a border between an erased state and a programmed state of a memory cell and that can be used for reading data from said memory cells.

9. The non-volatile semiconductor memory device according to claim 8, wherein said set of main reference cells further comprises a read reference cell provided to have a threshold voltage defining the border between an erased state and a programmed state of a memory cell and that is provided as a reference for verifying the state of said read reference cell comprised in said set of array reference cells.

10. The non-volatile semiconductor memory device according to claim 8, wherein said set of main reference cells further comprises a reference cell provided to have a threshold voltage corresponding to an over-erased state of a memory cell.

11. The non-volatile semiconductor memory device according to claim 8, wherein the memory cells are divided into a plurality of groups and wherein a set of array reference cells is provided for each group.

12. The non-volatile semiconductor memory device according to claim 11, wherein an additional status cell is provided in each of said set of programmable array reference cells to indicate by a predefined logical state if all cells of a predefined group of memory cells have an erased state.

13. A non-volatile semiconductor memory device comprising:
a memory area and a circuitry area, wherein said memory area comprises:
a plurality of multi-bit memory cells arranged in a memory array; and
a set of programmable array reference cells that are provided as references for reading said memory cells, each array reference cell comprising a transistor having an electric charge-trapping layer capable of storing two binary bits, the first one of the two bits defining the logical state of the reference cell and the second bit of the transistor of an erased array reference cell is set to a contrary logical state, and wherein said circuitry area comprises:
a set of main reference cells that are provided as references for verifying a state of the array reference cells or the memory cells.

14. A method of operating a non-volatile semiconductor memory device, said memory device comprising:
a memory area and a circuitry area, wherein said memory area comprises:
a plurality of memory cells arranged in a memory array; and
a set of programmable array reference cells that are provided as references for reading said memory cells, and wherein said circuitry area comprises:
a set of pre-programmed main reference cells that are provided as references for verifying the state of array reference cells or memory cells;
said method comprising:
setting at least one of said array reference cells to a predefined state using at least one of said pre-programmed main reference cells as a reference;
reading the state of at least one memory cell using the at least one of said array reference cells as a reference; and
verifying the state of at least one memory cell when erasing or programming the memory cell using at least one of said main reference cells as a reference.

15. The method according to claim 14, wherein setting a first of said array reference cells to an erased state comprises setting said first array reference cell to a programmed state and then setting said first array reference cell to an erased state.

16. The method according to claim 14, wherein:
a first reference cell of said set of main reference cells is pre-programmed to have a threshold voltage corresponding to a programmed state of a memory cell; and
a second reference cell of said set of main reference cells being pre-programmed to have a threshold voltage corresponding to an erased state of a memory cell;
said method comprising:
setting a first of said array reference cells to an erased state using said erased main reference cell as a reference;
setting a second of said array reference cells to a programmed state using said programmed main reference cell as a reference; and reading at least one of said memory cells using said erased and programmed reference cells for generating a comparative value for the reading operation.

17. The method according to claim 16, wherein setting a first of said array reference cells and setting a second of said array reference cells are carried out when writing data to said memory cells.

18. The method according to claim 14, wherein:
a first reference cell of said set of main reference cells is pre-programmed to have a threshold voltage corresponding to a programmed state of a memory cell;
a second reference cell of said set of main reference cells is pre-programmed to have a threshold voltage corresponding to an erased state of a memory cell; and
said set of array reference cells comprising a read reference cell;
said method comprising:
generating a comparative value using said erased and programmed main reference cells;
setting said read reference cell to a threshold voltage defining a border between an erased state and a programmed state of a memory cell using said comparative value; and
reading at least one of said memory cells using said read reference cell as a reference.

19. The method according to claim 14, wherein:
a first reference cell of said set of main reference cells is pre-programmed to have a threshold voltage corresponding to a programmed state of a memory cell;
a second reference cell of said set of main reference cells is pre-programmed to have a threshold voltage corresponding to an erased state of a memory cell;
a third reference cell of said set of main reference cells is pre-programmed to have a threshold voltage defining the border between an erased state and a programmed state of a memory cell; and
said set of array reference cells comprising a read reference cell;
said method comprising:
setting said read reference cell to a read state using said third maim reference cell as a reference; and
reading at least one of said memory cells using said read reference cell as a reference.

20. The method according to claim 14, further comprising:
assigning predefined memory cells to a group;
providing a status cell for said group of memory cells; and
setting said status cell to a predefined logical state when all memory cells assigned to said group have an erased state.

21. The method according to claim 20, wherein all cells of a group are coupled to a common wordline, each wordline being coupled to a status cell.

22. The method according to claim 21, further comprising:
reading said status cell prior to writing data to the cells assigned to said wordline; and
if the read state of the status cell is said predefined logical state, performing a re-programming of the programmed array reference using the programmed main reference cell.

23. The method according to claim 14, wherein the step of setting at least one of said array reference cells to a predefined state is repeated during the lifetime of said memory device.

24. The method according to claim 14, wherein the step of setting at least one of said array reference cells to a predefined state is carried out when a predefined user command provided for actions independent from the setting of array reference cells is launched.

25. A method for providing a non-volatile semiconductor memory device comprising:
providing a plurality of memory cells arranged in a memory array, and a set of at least two programmable array reference cells said memory array and programmable array reference cells located in a memory area, and a set of at least two programmable main reference cells located in a circuitry area, said circuitry area different than said memory area;
setting at least one of said main reference cells to have a threshold voltage corresponding to an erased state; and
setting at least one other main reference cell to have a threshold voltage corresponding to a programmed state.

26. The method according to claim 25, wherein setting of said at least one of said main reference cells and setting of at least one other main reference cell are carried out when testing the non-volatile semiconductor memory device.

27. A method for providing a non-volatile semiconductor memory device comprising:
providing a plurality of memory cells arranged in a memory array, a set of at least two programmable array reference cells, and a set of at least two programmable main reference cells;
setting at least one of said main reference cells to have a threshold voltage corresponding to an erased state during wafer sort; and
setting at least one other main reference cell to have a threshold voltage corresponding to a programmed state during wafer sort.

* * * * *

UNITED STATES PATENT AND TRADEMARK OFFICE
CERTIFICATE OF CORRECTION

PATENT NO. : 7,259,993 B2 Page 1 of 1
APPLICATION NO. : 11/145520
DATED : August 21, 2007
INVENTOR(S) : Redaelli et al.

It is certified that error appears in the above-identified patent and that said Letters Patent is hereby corrected as shown below:

In Col. 15, line 50, delete "veil" and insert --cell--.
In Col. 17, line 41, delete "maim" and insert --main--.
In Col. 18, line 34, delete "wherein" and insert --wherein the--.
In Col. 18, line 35, delete "and" and insert --and the--.

Signed and Sealed this

Twenty-seventh Day of November, 2007

JON W. DUDAS
*Director of the United States Patent and Trademark Office*